United States Patent Office 3,519,424
Patented July 7, 1970

3,519,424

PHOTOSENSITIVE COMPOUNDS AND ELEMENTS

George A. Reynolds, Frederick J. Rauner, and David J. McClune, Rochester, N.Y., assignors to Eastman Kodak Company, Rochester, N.Y., a corporation of New Jersey No Drawing. Filed Feb. 25, 1966, Ser. No. 529,923
Int. Cl. G03c *1/52, 1/70;* G03f *7/08*
U.S. Cl. 96—91 3 Claims

ABSTRACT OF THE DISCLOSURE 9-azidoacridines are photosensitive and can be coated onto a support material in the presence of a water-permeable, hydrophilic colloid to prepare the photographic elements useful in photomechanical reproduction such as by printing means.

This invention relates to a new class of compounds and to photosensitive elements prepared therefrom. In one of its more specific aspects, this invention relates to a new class of photosensitive compounds containing an azide group.

It has previously been known to the photographic industry that organic compounds containing an azide ($—N_3$) group frequently possess a photosensitive nature which may be utilized in various photographic processes. Many organic azide compounds have been employed for this purpose, among which are a number of heterocyclic azides such as 2-azidobenzoxazole and 2-azidobenzimidazole. Although these compounds are very light sensitive, they suffer from the disadvantage of being sensitive only to radiations of relatively short wavelengths. Thus, the photographic industry is in need of azide compounds which are sensitive to longer wavelengths of radiation.

One object of this invention is to provide a new class of compounds. Another object of this invention is to provide a new class of photosensitive compounds. A further object of this invention is to provide a new class of photosensitive heterocyclic compounds. A still further object of this invention is to provide a new class of photosensitive heterocyclic compounds which contain an azide group. A still further object of this invention is to provide a new class of photosensitive heterocyclic azide compounds which are sensitive to longer wavelengths of radiation than those described in the prior art. A still further object of this invention is to provide a photosensitive element containing one of said novel photosensitive heterocyclic azide compounds. Other objects of this invention will appear herein.

We have discovered that these and other objects may be accomplished through the practice of this invention, at least one embodiment of which comprises the utilization in photographic elements of a photosensitive heterocyclic azide compound having the structural formula:

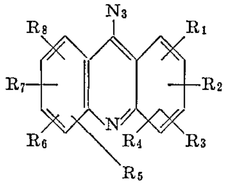

wherein $R_1$, $R_2$, $R_3$, $R_4$, $R_5$, $R_6$, $R_7$ and $R_8$ each may represent hydrogen or a substituent selected from the group consisting of halogen (e.g., bromo, chloro, fluoro, etc.); alkyl (e.g., methyl, ethyl, t-amyl, chloromethyl, trifluoromethyl, etc.); aryl (e.g., phenyl, naphthyl, chlorophenyl, bromophenyl, tolyl, etc.); alkoxy (methoxy, ethoxy, etc.); carboalkoxy (e.g., carbomethoxy, carbethoxy, etc.); amino (e.g., amino, methylamino, acetamido, etc.); nitro; and cyano; and wherein any two R's taken together at consecutive positions may represent the atoms necessary to complete an aromatic ring.

Especially useful compounds embraced by the above structural formula are those wherein $R_1$ and $R_8$ represent hydrogen.

For the purposes of nomenclature, numbering of the 9-azidoacridine structure is accomplished in the following manner:

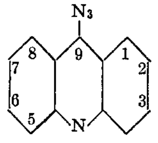

Specific examples of compounds falling within the above structural formula and definition would include, but not be limited to:

(1) 9-azidoacridine

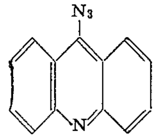

(2) 2-chloro-9-azidoacridine

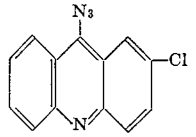

(3) 2-bromo-9-azidoacridine

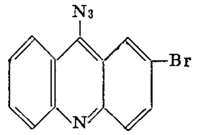

(4) 2-methyl-9-azidoacridine

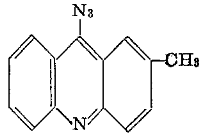

(5) 7-t-amyl-9-azidoacridine

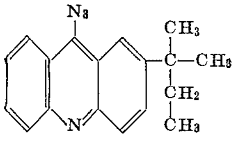

(6) 2-trifluoromethyl-9-azidoacridine

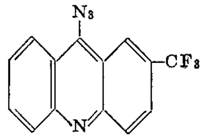

(7) 2-phenyl-9-azidoacridine

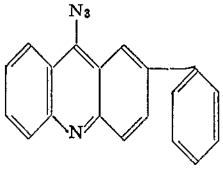

(2) 1,2,3,4-tetramethyl-9-azidoacridine

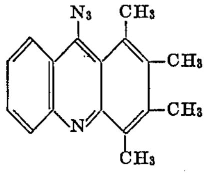

(9) 2(o-chlorophenyl)-9-azidoacridine

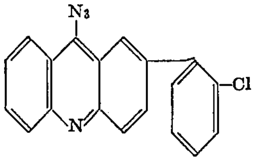

(10) 2-methoxy-9-azidoacridine

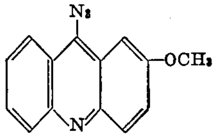

(11) 2-ethoxy-9-azidoacridine

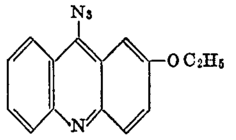

(12) 4-carbethoxy-9-azidoacridine

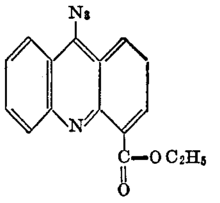

(13) 4-carbomethoxy-9-azidoacridine

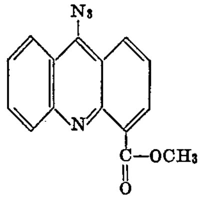

(14) 2-amino-9-azidoacridine

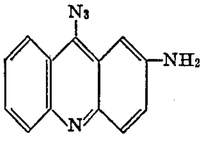

(15) 2-methylamino-9-azidoacridine

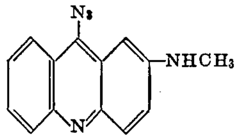

(16) 2-acetamido-9-azidoacridine

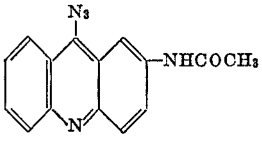

(17) 2-nitro-9-azidoacridine

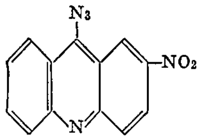

(18) 3-nitro-9-azidoacridine

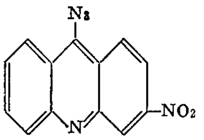

(19) 2-cyano-9-azidoacridine

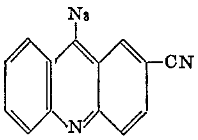

(20) benzo[b]-9-azidoacridine

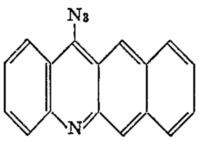

(21) 2-chloro-7-t-amyl-9-azidoacridine

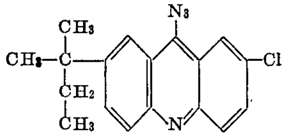

(22) 2-methoxy-6-chloro-9-azidoacridine

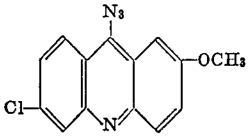

(23) 1,2,3,4-tetrahydro-9-azidoacridine

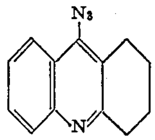

The above-listed compounds possess the distinct advantage of being sensitive to longer wavelengths of radiation than has previously been attainable with heterocyclic azides. For example, the spectral response of 9-azidoacridine covers the range from about 208 m$\mu$ to about 540 m$\mu$. In addition, the spectral response of substituted 9-azidoacridines is very similar to that of the present compound; for example, the response of 2-chloro-7-t-amyl-9-azidoacridine (compound 21 above) is from about 340 m$\mu$ to about 510 m$\mu$.

The class of compounds comprising 9-azidoacridine and derivatives thereof are preferably prepared by reacting sodium azide and the 9-chloroacridine derivative corresponding to the desired product. For example, if 2-methoxy-9-azidoacridine is the desired product, the reactants may be sodium azide and 2-methoxy-9-chloroacridine.

The novel compounds of this invention are soluble in many organic solvents, aqueous solutions of inorganic acids, and anhydrous organic acids. Non-solvents are few but include water, aqueous alkaline solution, glycerin, and methyl abietate.

These novel heterocylcic azides possess advantageous characteristics other than their longer wavelength photosensitivity. For example, these compounds have the ability to form films when coated from a binder.

The following specific examples will serve to more fully explain the practice of my invention. However, it will be understood that these are only examples and in no way limiting of this invention.

EXAMPLE 1

A mixture of 50 g. N-phenylanthranilic acid and 250 g. phosphorus oxychloride was heated until the evolution of HCl ceased, after which the unused $POCl_3$ was removed by vacuum distillation. The residue was cooled, thinned with chloroform, and poured into a mixture of concentrated ammonia solution and ice. After heating to 40° C. and stirring, the chloroform layer was separated. The chloroform extracts were dried over $CaCl_2$, filtered, and the solvent was recovered by distillation, yielding 50 g. of 9-chloroacridine.

Twenty-five grams of 9-chloroacridine were mixed with 250 ml. acetone and heated to boiling on a steam bath. A small amount of insoluble material was filtered off and to the filtrate was added 10 g. $NaN_3$ previously dissolved in hot water. This reaction mixture was stirred and heated for one hour and, after diluting with water, the solid was collected and recrystallized from aqueous acetone to yield 22 g. of 9-azidoacridine.

A formulation of 9-azidoacridine was then prepared containing:

1.0 g. 9-azidoacridine,
1.0 g. cellulose acetate hydrogen phthalate, and
100.0 cc. 2-ethoxyethanol.

The formulation was whirl-coated at 30 r.p.m. until dry on an aluminum plate. The coated plate was exposed through a negative for two minutes to a 35-amp Macbeth arc at a distance of three feet, after which it was swab-developed with 0.1 N $NaHCO_3$.

The exposed and developed aluminum plate was then used in combination with a black printing ink (sold under the trade designation MLS 2100 by Addressograph-Multigraph Co.) on a lithographic press. Prints of excellent quality were obtained with no loss of image sharpness, clarity, or density in 1000 impressions.

EXAMPLE 2

The procedure of Example 1 was repeated with the exception that in the 9-azidocridine formulation, cellulose acetate hydrogen phthalate was replaced with polyvinyl cinnamate phthalate. The plate operated satisfactorily as a lithographic printing plate.

EXAMPLE 3

Derivatives of 9-azidoacridine were prepared as indicated below:

(A) A solution comprising 3 g. 2,9-dichloroacridine and 100 ml. warm acetone was mixed with another solution comprising 2 g. sodium azide and 7 ml. water. The mixture was stirred, diluted with water, and chilled. The solid was collected and recrystallized from aqueous acetone to yield 2 g. of 2-chloro-9-azidoacridine.

(B) To a solution comprising 12 g. 2-methoxy-9-chloroacridine and 200 ml. hot acetone was added 5 g. sodium azide dissolved in a small amount of hot water. The mixture was heated and stirred for one hour and then diluted with water. The solid was collected and recrystallized from acetone to yield 10 g. of 2-methoxy-9-azidoacridine.

(C) A mixture of 16 g. 4-carbethoxy-9-acridone and 50 ml. phosphorus oxychloride was refluxed for one hour, after which the excess phosphorus oxychloride was removed under vacuum, and the residue was mixed with ice and $NH_4OH$ and extracted with chloroform. The chloroform extracts were combined, dried over $MgSO_4$, and the solvent removed. The residue was dissolved in 150 ml. of dimethylformamide, after which 4 g. sodium azide dissolved in 10 ml. of water was added. The mixture was stirred for 2 hours. After diluting the mixture with water and chilling, the solid was collected and recrystallized from aqueous acetone to yield 10 g. of 4-carbethoxy-9-azidocridine.

(D) A solution comprising 7 g. 3,9-dichloro-7-methoxyacridine in warm acetone was mixed with 4 g. sodium azide dissolved in water. The mixture was stirred for 2 hours, diluted with water, and chilled. The solid was collected and recrystallized from aqueous acetone to yield 7 g. of 3-chloro-7-methoxy-9-azidocridine.

(E) To a solution comprising 6 g. 2,9-dichloro-7-tert-amylacridine in dimethylformamide was added 4 g. sodium azide dissolved in water. The mixture was stirred, diluted with water, and chilled. The solid was collected and recrystallized from dimethylformamide to yield 4 g. of 2-chloro-7-tertt-amyl-9-azidoacridine.

(F) A solution comprising 6 g. benzo[b]-9-chloroacridine in 1.5 liters hot acetone was mixed with a solution comprising 3 g. sodium azide in 10 ml. water. The mixture was stirred for 2 hours, diluted with water and chilled to give a solid which was collected and recrystallized from aqueous acetone to yield 6 g. of benzo[b]-9-chloroacridine.

(G) A mixture of 10 g. 1,2,3,4-tetrahydro-9-acridone and 70 ml. phosphorus oxychloride was refluxed for 2 hours, the excess phosphorus oxychloride was removed under vacuum, and the residue was diluted with ice and ammonium hydroxide and extracted with chloroform. The extract was dried over $MgSO_4$ and the solvent removed. The residue was dissolved in 50 ml. acetone, after which 3.5 g. sodium azide dissolved in 10 ml. water was added. The mixture was stirred for 2 hours and diluted with water to yield 8 g. of 1,2,3,4-tetrahydro-9-azidoacridine.

Following the procedure outlined in Example 1, compounds (A)–(G), respectively, were made into coating formulations and coated on aluminum plates. The coated aluminum plates were exposed, swab-developed with 0.1 N $NaHCO_3$, and used as lithographic printing plates. Prints of excellent quality were obtained with no loss of image sharpness, clarity, or density, in 1000 impressions.

EXAMPLE 4

A plate of gravure copper was pumiced and, after rinsing in distilled water, was immersed for 30 seconds in 5% HCl. After rinsing and drying, it was whirl-coated at 40 r.p.m. with a solution comprising:

9-azidoacridine—1.0 g.
ethyl cellulose phthalate—1.0 g.
methyl ethyl ketone—100.0 cc.

The coating was dried for 30 minutes at 76° F. and then exposed for 2 minutes through a line negative to a 95-amp carbon arc which was 5 feet away. The exposed plate was developed by covering with a buffer solution (pH 10) comprising:

sodium hydroxide—1.76 g.
boric acid—3.09 g.
potassium chloride—3.76 g.
and water to make 1 liter.

A cotton swab was used to gently rub the plate end liberally coat it with the buffer solution. After 1–2 minutes, the non-exposed areas were removed. The remaining areas were readily visible due to the print-out tone of the sensitizer. Etching the copper with ferric chloride to a depth of 3–4 mils was carried out using well-known procedures. The etching took place only in the non-exposed areas. The desired image areas were satisfactorily protected from the etching action of the ferric chloride solution by the presence of the 9-azidoacridine resist formulation.

The novel class of compounds of this invention may be employed in combination with many polymeric film-forming carriers which, advantageously, are soluble in water or in aqueous alkaline solutions. These film-forming polymers may be either light-inert (as in Example 1) or light-sensitive (as in Example 2). Specific examples of suitable light-inert polymers are cellulose acetate hydrogen phthalate, polyvinyl pyrrolidone, polyvinyl phthalate, phthalated polyvinyl acetal, ethyl cellulose phthalate, etc. Specific examples of suitable light-sensitive polymers are polyvinyl cinnamate phthalate, polyvinyl cinnamate succinate, polyvinylacetate azido phthalate, etc.

The pH of the solution used for swab-development of the exposed plate should be on the alkaline side, preferably at about pH 9.0. If the pH is too far below 9.0, the plate may not fully develop. On the other hand, as the pH rises above 10.0, there may be a tendency for loss of speed and fine-image detail to occur, depending on the particular film-forming polymer used as the carrier.

A satisfactory and operable range of ratios for azide sensitizer to polymeric film-forming carriers is from about 2:1 to about 1:2. If the proportion of the carrier is too high, lower sensitivity may result and excessive swelling may occur due to insufficient insolubilization when the plate is processed. If the proportion of carrier is too low, coatings may tend to be non-uniform and irregular.

Although the invention has been described in considerable detail with particular reference to certain preferred embodiments thereof, it will be understood that variations and modifications can be effected within the spirit and scope of the invention as described hereinbefore and as defined in the appended claims.

We claim:

1. A photosensitive element comprising:

(a) a support, and (b) a photosensitive layer, said layer comprising a light-sensitive, a water-permeable hydrophilic colloid selected from the group consisting of polyvinyl cinnamate phthalate, polyvinyl cinnamate succinate, polyvinylacetate azido phthalate and a photosensitive compound having the general formula:

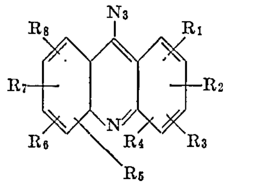

wherein each of $R_1$, $R_2$, $R_3$, $R_4$, $R_5$, $R_6$, $R_7$, and $R_8$ can represent a substituent selected from the group consisting of hydrogen, halogen, alkyl, aryl, alkoxy, carboalkoxy, amino, nitro, and cyano; and wherein any two R's taken together at consecutive positions can represent the atoms necessary to complete an aromatic ring.

2. A photosensitive element as defined by claim 1 wherein said photosensitive compound is 9-azidoacridine.

3. A method for preparing a printing plate which comprises imagewise exposing a photosensitive element comprising a support having coated thereon a light-sensitive composition consisting essentially of a light-sensitive water-permeable hydrophilic colloid selected from the group consisting of polyvinyl cinnamate phthalate, polyvinyl cinnamate succinate, polyvinylacetate azido phthalate and a compound having the formula:

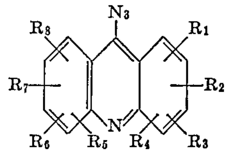

wherein each of $R_1$, $R_2$, $R_3$, $R_4$, $R_5$, $R_6$, $R_7$, and $R_8$ can represent a substituent selected from the group consisting of hydrogen, halogen, alkyl, aryl, alkoxy, carboalkoxy, amino, nitro, and cyano; and wherein any two R's taken together at consecutive positions can represent the atoms necessary to complete an aromatic ring, and thereafter treating the said exposed light-sensitive composition to an aqueous alkaline solution to selectively remove said hydrophilic colloid in unexposed areas.

References Cited

UNITED STATES PATENTS

| | | | |
|---|---|---|---|
| 3,387,976 | 6/1968 | Sorkin | 96—35.1 |
| 2,848,328 | 8/1958 | Hepher | 96—75 XR |
| 3,061,435 | 10/1962 | Tomanek et al. | 96—75 |
| 3,062,650 | 11/1962 | Sagura et al. | |
| 3,072,485 | 1/1963 | Reynolds et al. | |
| 3,282,693 | 11/1966 | Sagura et al. | |
| 3,284,198 | 11/1966 | Grotta et al. | 96—75 XR |

OTHER REFERENCES

J. Kosar: "Light-Sensitive Systems," John Wiley & Sons, Aug. 27, 1965, pp. 330–336.

Minsk et al.: "Journal of Applied Polymer Science," vol. II, issue No. 6, 1959, pp. 302–307.

Robertson et al.: "Journal of Applied Polymer Science," vol. II, issue No. 6, 1959, pp. 308–311.

NORMAN G. TORCHIN, Primary Examiner

C. BOWERS, Assistant Examiner

U.S. Cl. X.R.

96—115, 35.1, 33, 36.3; 260—279, 349